(12) United States Patent
Wu

(10) Patent No.: US 11,252,839 B2
(45) Date of Patent: Feb. 15, 2022

(54) COMPUTER LIQUID COOLING SYSTEM

(71) Applicant: VAST GLORY ELECTRONICS & HARDWARE & PLASTIC(HUI ZHOU) LTD., Hui Zhou (CN)

(72) Inventor: Yuan Wu, Hui Zhou (CN)

(73) Assignee: VAST GLORY ELECTRONICS & HARDWARE & PLASTIC(HUI ZHOU) LTD., Hui Zhou (CN)

( * ) Notice: Subject to any disclaimer, the term of this patent is extended or adjusted under 35 U.S.C. 154(b) by 0 days.

(21) Appl. No.: 17/002,651

(22) Filed: Aug. 25, 2020

(65) Prior Publication Data
US 2021/0360825 A1 Nov. 18, 2021

(30) Foreign Application Priority Data

May 15, 2020 (CN) .......................... 202010412773.6

(51) Int. Cl.
*H05K 7/20* (2006.01)
*G06F 1/20* (2006.01)

(52) U.S. Cl.
CPC ........... *H05K 7/20272* (2013.01); *G06F 1/20* (2013.01); *H05K 7/20263* (2013.01)

(58) Field of Classification Search
CPC . H01L 23/473; H01L 23/3672; H01L 23/367; H01L 23/46; G06F 1/20; G06F 2200/201; G06F 1/203; H05K 7/20781; H05K 7/20772; H05K 7/20272; H05K 7/20263; H05K 7/20763; H05K 7/20218; H05K 7/20927

See application file for complete search history.

(56) References Cited

U.S. PATENT DOCUMENTS

| 8,225,852 | B2 * | 7/2012 | Wu ...................... | F02B 29/0462 165/140 |
|---|---|---|---|---|
| 2005/0067145 | A1 * | 3/2005 | Matsushita ........... | H01L 23/473 165/80.3 |
| 2005/0081534 | A1 * | 4/2005 | Suzuki .................... | F28D 15/00 62/50.2 |
| 2005/0088820 | A1 * | 4/2005 | Naganawa ............ | F28F 9/0246 361/697 |
| 2007/0241648 | A1 * | 10/2007 | Garrett ...................... | G06F 1/20 312/236 |
| 2008/0179044 | A1 * | 7/2008 | Hu ......................... | H01L 23/473 165/80.4 |
| 2008/0179045 | A1 * | 7/2008 | Hu ......................... | H01L 23/473 165/80.4 |

(Continued)

*Primary Examiner* — Adam B Dravininkas
(74) *Attorney, Agent, or Firm* — Maschoff Brennan

(57) ABSTRACT

A computer liquid cooling system includes a radiator having a built-in fluid tank, at least one heat exchanger pump and a plurality of fluid conduits. The radiator includes at least one first flow port and at least one second flow port for attachment of the plurality of fluid conduits thereto for actively moving a cooling fluid to and from the at least one heat exchanger pump. Heat generated from a heat generating device is transferred to cooling fluid flowing through the at least one heat exchanger pump, and then output to the radiator. The heated cooling fluid flows through the radiator having the built-in fluid tank, cooling along a plurality of heat exchanger fins. The cooling fluid flows to the heat exchanger pump to once again begin the cooling loop.

17 Claims, 18 Drawing Sheets

(56) References Cited

U.S. PATENT DOCUMENTS

| | | | | |
|---|---|---|---|---|
| 2009/0272515 A1* | 11/2009 | Wu | ................... | F02B 29/0462 |
| | | | | 165/140 |
| 2013/0213624 A1* | 8/2013 | Fujii | .................. | F28D 1/05375 |
| | | | | 165/173 |
| 2018/0228040 A1* | 8/2018 | Lykke | ................. | H05K 5/0213 |
| 2018/0308786 A1* | 10/2018 | Huang | ................. | H01L 23/433 |

\* cited by examiner

COMPUTER LIQUID COOLING SYSTEM

CROSS-REFERENCE TO RELATED APPLICATIONS

This non-provisional application claims priority under 35 U.S.C. § 119(a) on Patent Application No(s). 202010412773.6 filed in China on May 15, 2020, the entire contents of which are hereby incorporated by reference.

TECHNICAL FIELD

This disclosure relates to the field of heat transfer, more particularly to computer liquid cooling systems.

BACKGROUND

During operation of computers, servers or electronic systems, heat generated by processors must be dissipated quickly and efficiently to keep operating temperatures within manufacturer recommended ranges. As these electronic systems increase in functionality and applicability so does operating speed of the processors used therein. With an increase in operating speeds and an increase in the number of processors employed, power requirements of the electronic systems also increase, which in turn, increases cooling requirements.

Several techniques have been developed for extracting heat from processors in electronic systems. One such technique is an air-cooling system, wherein a heat sink is in thermal contact with a processor and transports heat away from the processor and a fan is mounted on top of a heat sink to remove heat from the heat sink by blowing air through segments thereof. This air-cooling system may be sufficient for everyday uses; however, it may be noisy and becomes less effective and more cumbersome with higher processor speeds, increased number of processors employed, and greater heat output. Another technique uses cooling fluid to cool a processor by forcing the cooling fluid to circulate inside a closed system by a pumping unit, wherein the closed system may also have a fluid reservoir, a radiator in which the cooling fluid is circulated thereabout and a water block. The water block is typically where the cooling fluid engages in thermal contact with the heat generating processors.

Generally, liquid heat exchange systems may be less noisy and more efficient than air-cooling systems. However, conventional liquid heat exchange system designs consist of many components, which increases total installation time, risks for leakage, and component placement problems. Thus, in some applications, it is necessary to position one or more components on the outside of the electronic device housing, such as, the fluid reservoir; whereby at least one hose is required, from the fluid reservoir on the outside, leading into the electronic device housing and an attachment mechanism to the housing or separated assembly.

SUMMARY

Accordingly, this disclosure provides a computer liquid cooling system which is capable of decreasing total installation time, risks for leakage, and component placement problems.

One embodiment of the disclosure provides a computer liquid cooling system including a radiator, at least one heat exchanger pump and a plurality of fluid conduits. The radiator has a built-in fluid tank and includes a first chamber, a second chamber and a plurality of longitudinal fluid channels connected to the first chamber and the second chamber. The fluid conduits are coupled to the heat exchanger pump, the first chamber and the second chamber so as to form a cooling loop for a cooling fluid to circulate therein. The built-in fluid tank is in fluid communication with the second chamber via a tank conduit, and the built-in fluid tank has a chamber for storing the cooling fluid. The built-in fluid tank is disposed between the first chamber and the second chamber or disposed on one side of the second chamber located away from the first chamber.

According to the computer liquid cooling system as described above, the computer liquid cooling system includes a radiator having a built-in fluid tank, at least one heat exchanger pump, and a plurality of fluid conduits. Heat generated from a heat generating device is transferred to cooling fluid flowing through the heat exchanger pump, and then output to the radiator. The heated cooling fluid flows through the radiator having the built-in fluid tank, cooling along a plurality of heat exchanger fins. The cooling fluid flows to the heat exchanger pump to once again begin the cooling loop. The built-in fluid tank not only accounts for fluid loss over time due to permeation, it also decreases air bubbles leading to greater efficiency as air bubbles are gradually replaced during fluid circulation. Additionally, the built-in fluid tank eliminates the need for separated assembly of a reservoir. Thus, it is no longer necessary to allocate for the positioning of the reservoir within the computer chassis or electronic system, decreasing total installation time, risks for leakage, and component placement problems.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

Figure 1A:
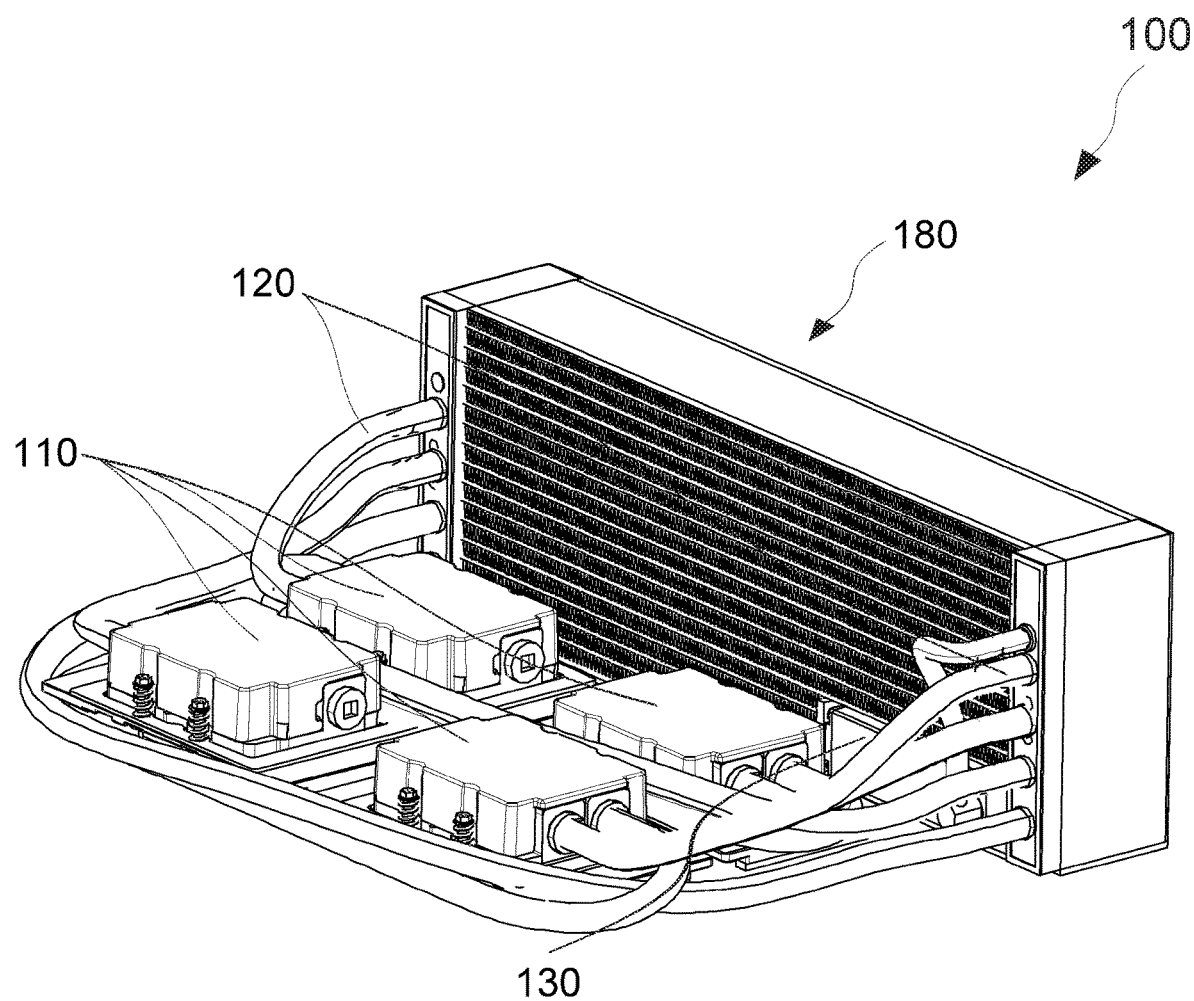
FIG. 1A is a schematic perspective view of a computer liquid cooling system in accordance with one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

The following describes various principles related to heat exchange systems by way of reference to specific examples of pumping units, fluid reservoirs, radiators, water blocks, and computer liquid cooling systems, including arrangements and examples of pumping units, fluid reservoirs, radiators, and water blocks embodying innovative concepts. More particularly, but not exclusively, such innovative principles are described in relation to selected examples of pumping units, fluid reservoirs, radiators, water blocks, and computer liquid cooling systems and well-known functions or constructions are not described in detail for purposes of succinctness and clarity. Nonetheless, one or more of the disclosed principles can be incorporated in various other embodiments of pumping units, fluid reservoirs, radiators, water blocks, and computer liquid cooling systems to achieve any of a variety of desired outcomes, characteristics, and/or performance criteria.

Thus, pumping units, fluid reservoirs, radiators, water blocks, and computer liquid cooling systems having attributes that are different from those specific examples discussed herein can embody one or more of the innovative principles, and can be used in applications not described herein in detail. Accordingly, embodiments of pumping units, fluid reservoirs, radiators, water blocks, and computer liquid cooling systems not described herein in detail also fall within the scope of this disclosure, as will be appreciated by those of ordinary skill in the relevant art following a review of this disclosure.

Example embodiments as disclosed herein are directed to computer liquid cooling systems. The computer liquid cooling system extracts heat generated by one or more heat generating devices within a computer or server system. The heat generating devices include, but are not limited to, one or more central processing units (CPU), CPU chipsets, one or more graphics processing units (GPUs), and/or one or more physics processing units (PPUs), mounted on a motherboard and/or expansion card, or the like.

The computer liquid cooling system is configured within a computer chassis or as part of an electronic system that includes heat generating devices to be cooled. The computer liquid cooling system includes at least one liquid-based cooling loop, and may include one or more fans. The one or more fans may be coupled to a back end of a radiator of the computer liquid cooling system via a fastener (e.g., bolts, screws, an adhesive material, etc.) at a structural portion of the radiator, pulling air through the radiator to an air plenum of the computer chassis or electronic system or to an outside of the computer chassis or electronic system. Those of ordinary skill in the relevant art may readily appreciate that the type and size of fans may be varied as long as air may be pulled through the radiator to an air plenum of the computer chassis or electronic system or to an outside of the computer chassis or electronic system.

In some embodiments, the one or more fans may be high pressure (e.g., a high airflow) fans. In some embodiments, the one or more fans may have reinforced fan blades. In some embodiments, the design of the fan blades and/or other components (e.g., bearings, etc.) may be such that noise generated during operation may be minimized. In some embodiments, the fans may be constructed using fasteners (e.g., anti-vibration rivets, gaskets, etc.) that may be used to minimized vibration during operation.

Each cooling loop includes a fluid-to-air heat exchanger or radiator having a built-in fluid tank and at least one heat exchanger pump. The built-in fluid tank accounts for fluid loss over time due to permeation. The components in the cooling loop are coupled via a plurality of fluid conduits. The radiator includes at least one first flow port and at least one second flow port for attachment of the plurality of fluid conduits thereto for actively moving a cooling fluid to and from the at least one heat exchanger pump. Heat generated from a heat generating device is transferred to cooling fluid flowing through the at least one heat exchanger pump. The heated cooling fluid is output from the heat exchanger pump and input to the radiator. The heated cooling fluid flows to and through the radiator having a built-in fluid tank and a plurality of heat exchanger fins. The cooling fluid flows from the radiator to the heat exchanger pump to once again begin the cooling loop. Although the cooling loop includes a heat exchanger pump, more than one heat exchanger pump may be coupled to the radiator. In this manner, multiple heat generating devices and/or a larger heat generating area may be cooled. Each of the heat exchanger pumps may be adjacently configured in rows or differently, allowing for design flexibility enabling application-specific configurations.

Figure 1B:
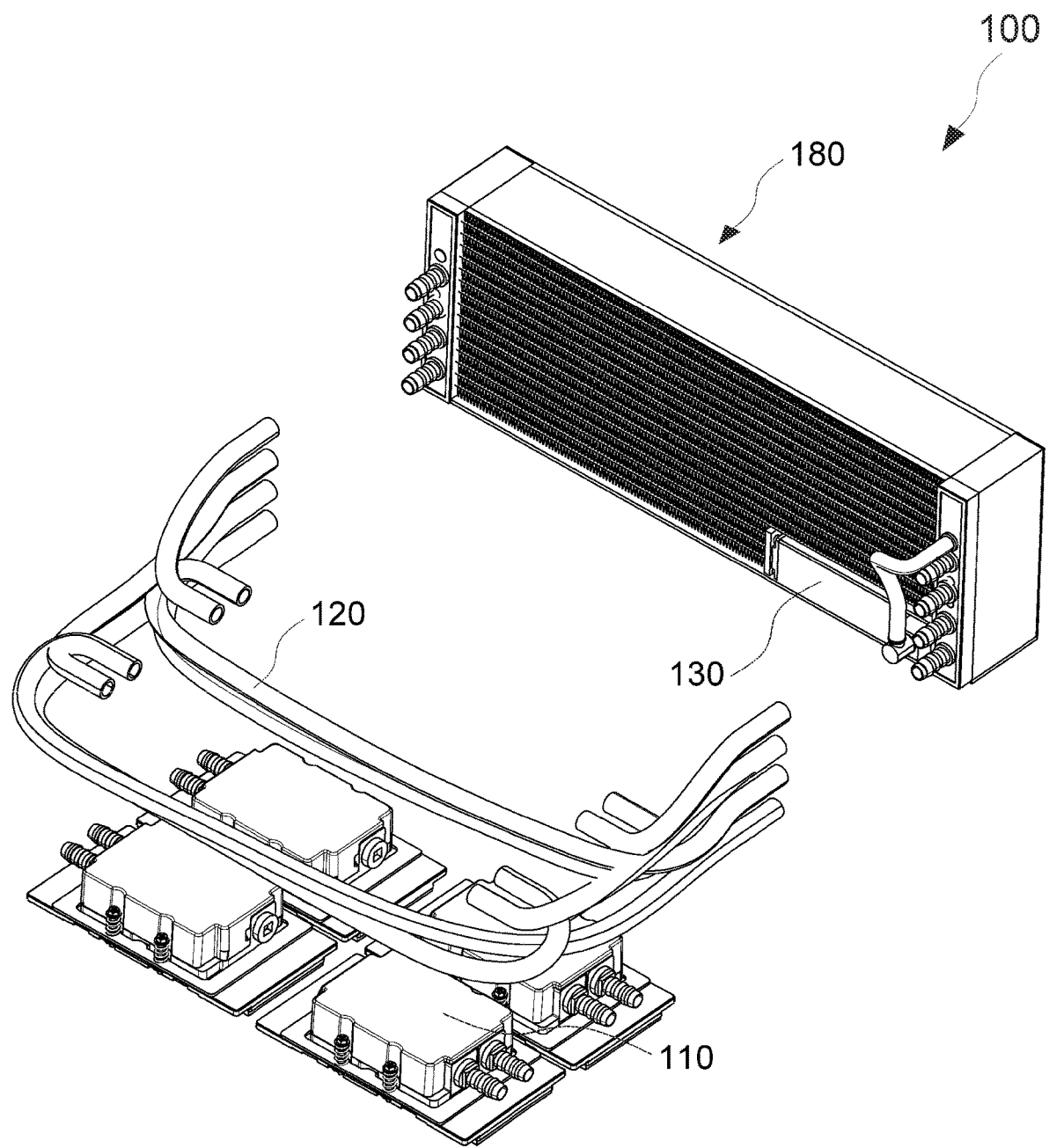
FIG. 1B is an exploded view of the computer liquid cooling system of FIG. 1A.

FIG. 1A is a schematic perspective view of a computer liquid cooling system in accordance with one embodiment of the disclosure. FIG. 1B is an exploded view of the computer liquid cooling system of FIG. 1A. Referring to FIG. 1A and FIG. 1B, a computer liquid cooling system 100 includes a radiator 180 having a built-in fluid tank 130, at least one heat exchanger pump 110 positioned on one side of the radiator 180, and a plurality of fluid conduits 120 coupled to the heat exchanger pump 110 and the radiator 180. Heat generated from a heat generating device is transferred to cooling fluid flowing through the heat exchanger pump 110 and output to the radiator 180. The heated cooling fluid flows to and through the radiator 180. The cooling fluid flows from the radiator 180 to the heat exchanger pump 110 to once again begin the cooling loop. The built-in fluid tank 130 accounts for fluid loss over time due to permeation.

In one embodiment, the amount of the at least one heat exchanger pump 110 is four, but the present disclosure is not limited thereto. In alternative embodiments, one heat exchanger pump or more than four heat exchanger pumps may be provided. Those of ordinary skill in the relevant art may readily appreciate that the amount of the at least one heat exchanger pump 110 may be varied as long as heat generated from a heat generating device may be transferred to cooling fluid flowing through the at least one heat exchanger pump 110, and then the cooling fluid may flow to the radiator 180 and be received once again by the at least one heat exchanger pump 110 to begin the cooling loop again.

In one embodiment, the heat exchanger pump 110 pumps the cooling fluid from an inlet pump connector attached thereto, through a second far side pump and a first near side pump of a flow-directing reservoir and past heat-dissipating fins in a second-level indented water block area of a second surface of a water block in thermal contact with the heat generating device to an outlet pump connector attached thereto.

The heat exchanger pump 110 and the fluid conduits 120, which are possibly manufactured from a plastic material, may be "metalized" in order to minimize fluid diffusion or evaporation of the fluid. The metal may be provided as a thin layer of metal coating provided on either or on both of the internal side or the external side of the plastic part. Generally, the same metal material is used throughout the cooling loop (e.g. including the radiator), such as, copper. The fluid conduits 120 may be manufactured from a flexible plastic material and/or a rigid metal material.

The cooling fluid of the computer liquid cooling system may be any type of cooling fluid such as water, water with additives such as anti-fungicide, water with additives for improving heat conducting or other special compositions of cooling fluids such as electrically non-conductive liquids or liquids with lubricant additives or anti-corrosive additives.

Control of the heat exchanger pump 110 driven by an AC or DC electrical motor, preferably takes place by means of an operative system or like means of a computer or electronic system itself, wherein the computer or electronic system includes a means for measuring load and/or temperature of one or more processors. Using the measurement performed by the operative system or a like system eliminates the need for special means for operating the pump. Communication between the operative system or a like system and a processor for operating the pump may take place along already established communication links in the computer system such as a USB-link. Thereby, a real-time communication between the cooling system and the computer liquid cooling system may be provided without any special means for establishing the communication.

Further control strategies utilizing the operative system or a like system of the computer system may involve balancing the rotational speed of the heat exchanger pump 110 as a function of the cooling capacity needed. If a lower cooling capacity is needed, the rotational speed of the heat exchanger pump 110 may be limited, thereby limiting the noise generated by the motor driving the heat exchanger pump 110.

Figure 2A:
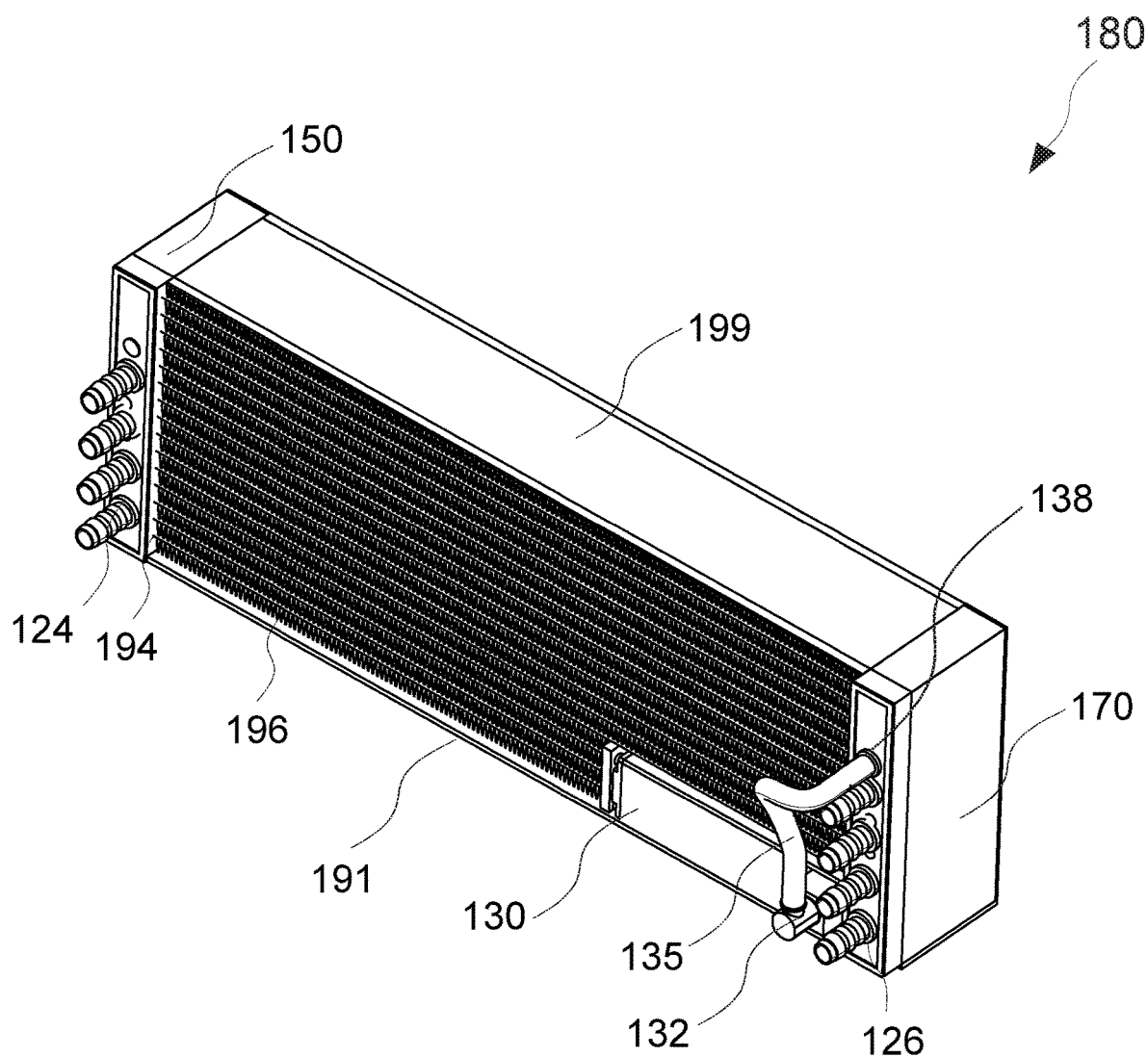
FIG. 2A is a schematic view of a radiator of FIG. 1A.
Figure 2B:
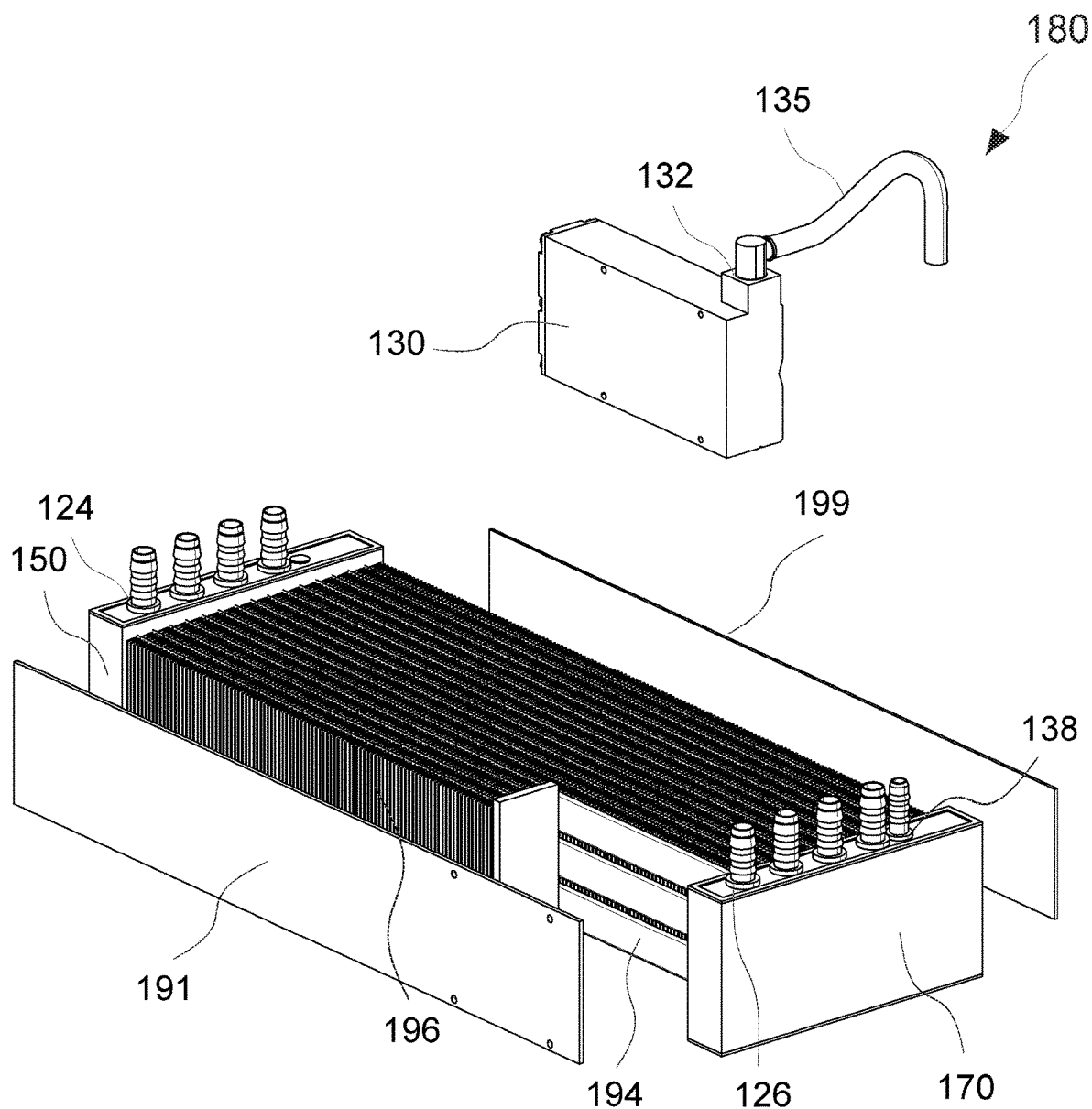
FIG. 2B is an exploded view of the radiator of FIG. 2A.
Figure 2C:
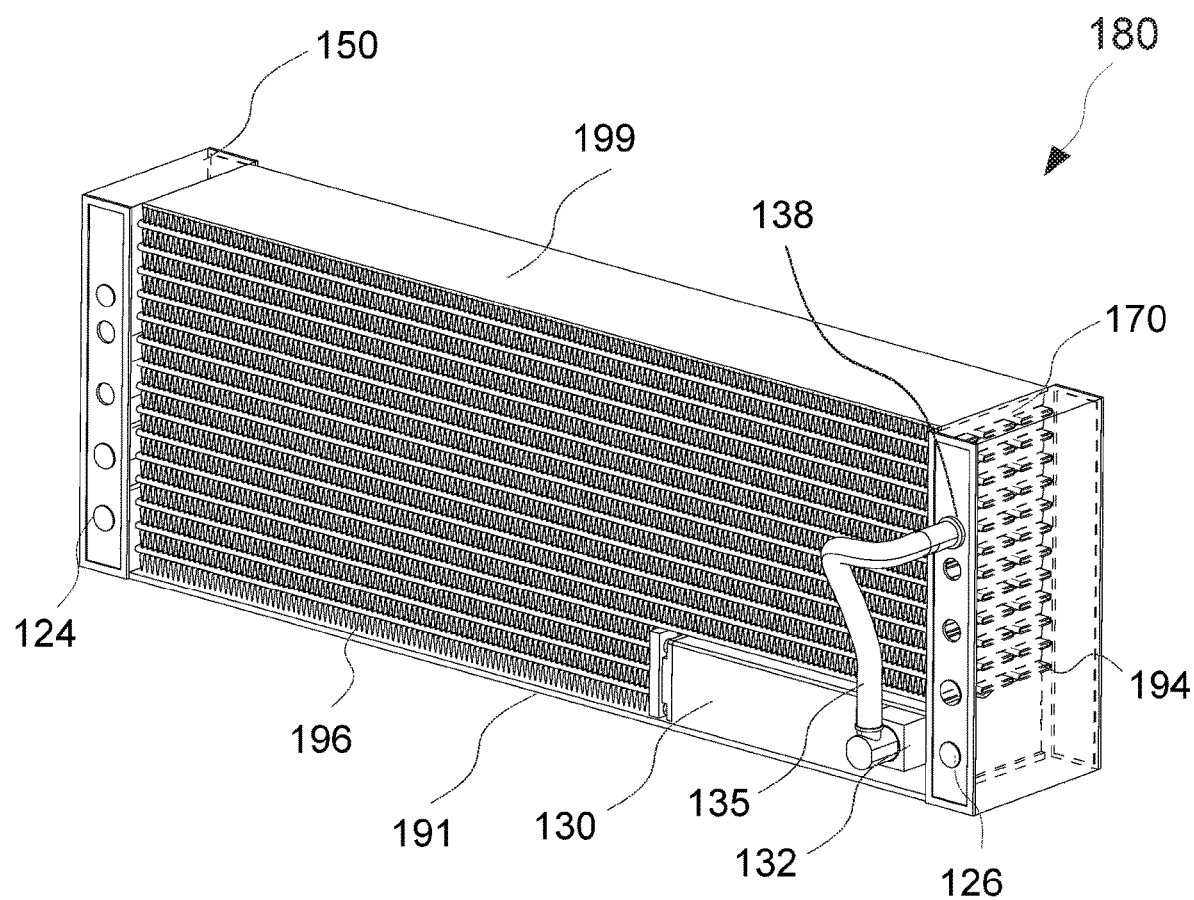
FIG. 2C illustrates an interior of a second end of the radiator of FIG. 2A.
Figure 2D:
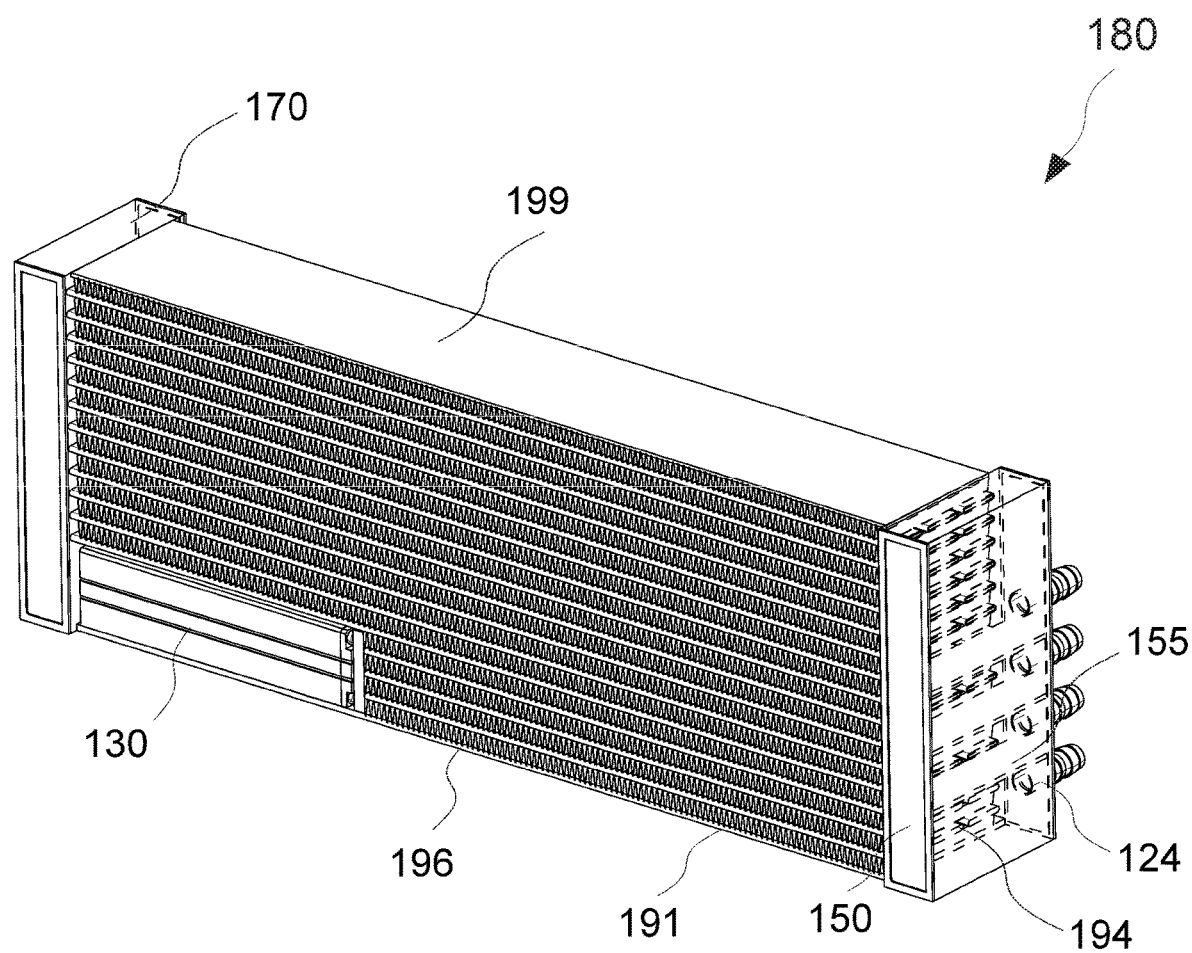
FIG. 2D illustrates an interior of a first end of the radiator of FIG. 2A.

FIG. 2A is a schematic view of a radiator of FIG. 1A. FIG. 2B is an exploded view of the radiator of FIG. 2A. FIG. 2C illustrates an interior of a second end of the radiator of FIG. 2A. FIG. 2D illustrates an interior of a first end of the radiator of FIG. 2A. Referring to FIG. 2A to FIG. 2D, and referring to FIG. 1A and FIG. 1B, the radiator 180 having the built-in fluid tank 130 further includes a top encasement 199, a bottom encasement 191, and a plurality of longitudinal fluid channels 194 disposed therebetween in rows and columns. Those of ordinary skill in the relevant art may readily appreciate that the top encasement 199 and the bottom encasement 191 may include one or more intermediate encasements between the top encasement 199, the bottom encasement 191 and the longitudinal fluid channels 194, and the top encasement 199 and the bottom encasement 191 may include a securing means to the longitudinal fluid channels 194, but the present disclosure is not limited thereto. Those of ordinary skill in the relevant art may also readily appreciate that the total amount, amount of rows, and amount of columns of the longitudinal fluid channels 194 may be varied, depending on the required level of heat extraction, the performance characteristics and amount of the at least one heat exchanger pump 110, and the available space within the computer chassis or electronic system for mounting of the computer liquid cooling system 100, as long as heat generated from a heat generating device may be transferred to cooling fluid flowing through the heat exchanger pump 110, and then the cooling fluid may flow through the longitudinal fluid channels 194 and be received once again by the heat exchanger pump 110 to begin the cooling loop again. In some embodiments, the total amount of the longitudinal fluid channels 194 of the radiator 180 is forty-five, and the longitudinal fluid channels 194 is disposed in fifteen rows and three columns. In one embodiment, the longitudinal fluid channels 194 is separated by a spacing. The spacing between the rows is larger than the spacing between the columns.

In one embodiment, a plurality of fin heatsinks 196 is transversely disposed across each of the adjacent spacing between the rows of the longitudinal fluid channels 194 and across each of the three row columns. In some embodiments, each of the fin heatsinks 196 is disposed at an angle relative to each adjacent row of the longitudinal fluid channels 194, but the present disclosure is not limited thereto. Those of ordinary skill in the relevant art may readily appreciate that each of the fin heatsinks 196 may not be disposed at an angle, be varied, or any combination thereof, depending on the required level of heat extraction, as long as each of the fin heatsinks 196 generally spans each of the adjacent spacing between the rows of the longitudinal fluid channels 194 and across each of the three row columns so that air can be passed through the radiator 180 across the surfaces of the fin heatsinks 196 and the longitudinal fluid channels 194 for convective heat transfer away from the radiator 180.

In one embodiment, the radiator 180 having the built-in fluid tank 130 further includes a first chamber 150 having at least one first flow port 124 and a second chamber 170 having at least one second flow port 126, opposite the first chamber 150. The top encasement 199, the bottom encasement 191, the longitudinal fluid channels 194, and the fin heatsinks 196 are disposed between the first chamber 150 and the second chamber 170, and each of the longitudinal fluid channels 194 provides fluid communication between the first chamber 150 and the second chamber 170. In some embodiments, a threaded fitting may be attached to the first flow port 124 and the second flow port 126 for easy coupling of the fluid conduits 120 thereto, for cooling fluid flow of the cooling loop. In some embodiments, the amount of the at least one first flow port 124 is four, which is equal to the amount of the at least one heat exchanger pump 110, and all of the first flow ports 124 are cooling fluid flow inlets, and the amount of the at least one second flow port 126 is four, which is equal to the amount of the at least one heat exchanger pump 110, and all of the second flow ports 126 are cooling fluid flow outlets, but the present disclosure is not limited thereto. Those of ordinary skill in the relevant art may readily appreciate that the position of the first chamber 150 and the second chamber 170 can be interchanged and the amount of the at least one first flow port 124 and the amount of the at least one second flow port 126 can vary with the amount of the at least one heat exchanger pump 110, as long as heat generated from a heat generating device may be transferred to cooling fluid flowing through the heat exchanger pump 110, and then the cooling fluid may flow to the radiator 180 and be received once again by the heat exchanger pump 110 to begin the cooling loop again. In some embodiments, each first flow port 124 opposite the at least one second flow port 126 are disposed along a same plane relative to the bottom encasement 191, evenly spaced from the bottom encasement 191 to the top encasement 199. In some embodiments, the distance from the at least one first flow port 124 and the at least one second flow port 126 closest to the bottom encasement 191, to the bottom encasement 191, is equal to or less than the spacing from the at least one first flow port 124 and the at least one second flow port 126 closest to the top encasement 199, to the top encasement 199.

In one embodiment, the first chamber 150 further includes at least one chamber separator 155 separating the cooling fluid flow from each of the at least one first flow port 124 and communicating with the longitudinal fluid channels 194 via a water-tight seal for more efficient cooling fluid flow. In some embodiments, the amount of the at least one first flow port 124 is four, the first flow ports 124 are cooling fluid flow inlets, and the amount of the at least one chamber separator 155 is three. Three of the four first flow ports 124 are disposed closer to the bottom encasement 191, and each of the three first flow ports 124 includes three rows of the longitudinal fluid channels 194. The first flow port 124 closest to the top encasement 199 includes three rows of the longitudinal fluid channels 194. Those of ordinary skill in the relevant art may readily appreciate that as the amount of the at least one heat exchanger pump 110 varies, so does the required fluid flow inlets and outlets and the amount of the at least one chamber separator 155 separating the cooling fluid flow from each first flow port 124 and communicating with the longitudinal fluid channels 194, as long as the cooling fluid flow from each first flow port 124 is separated by a water-tight seal for more efficient cooling fluid flow and the distance from the first flow port 124 and the second flow port 126 closest to the bottom encasement 191, to the bottom encasement 191, is equal to or less than the spacing from the first flow port 124 and the second flow port 126 closest to the top encasement 199, to the top encasement 199.

In some embodiments, the built-in fluid tank 130 includes a tank outlet port 132, and the second chamber 170 further includes a tank flow port 138. The tank outlet port 132 defines a passage for cooling fluid to travel between the built-in fluid tank 130 and the second chamber 170 via a tank conduit 135. In some embodiments, a fill cap is removably disposed with the tank outlet port 132 and the tank conduit 135 may be coupled thereto. The fill cap is disposed adjacent to a portion of the second chamber 170 for adding or removing cooling fluid to or from the built-in fluid tank 130.

The built-in fluid tank 130 provides a chamber for storing the cooling fluid. A volume of the cooling fluid may be retained in the built-in fluid tank 130 during operation of the computer liquid cooling system 100. In some embodiments, a visible portion of the cooling fluid in the built-in fluid tank 130 via a transparent material may allow users to visually observe an amount of the cooling fluid in the cooling loop, and determine when additional cooling fluid may need to be added to the computer liquid cooling system 100. No additional space is needed to be allocated for the built-in fluid tank 130, fluid loss over time due to permeation may be mitigated, and air bubbles may gradually be replaced during fluid circulation, increasing cooling loop efficiency of the computer liquid cooling system 100.

In some embodiments, the computer liquid cooling system 100 is disposed such that the radiator 180 is positioned in a vertical plane. In alternative embodiments, the computer liquid cooling system 100 may be positioned in a horizontal or angled plane.

In one embodiment, the flow direction of the cooling fluid through each of the longitudinal fluid channels 194 of the radiator 180 is the same. Generally, as the rotor of the heat exchanger pump 110 spins and forces heated cooling fluid through an outlet pump connector, the heated cooling fluid flows through the fluid conduits 120 to each first flow port 124 of the first chamber 150 and sub-chambers defined by the at least one chamber separator 155, separating the heated cooling fluid flow from each first flow port 124, and communicating with the longitudinal fluid channels 194. As the heated cooling fluid flows through each of the longitudinal fluid channels 194, air is passed through the radiator 180 across the surfaces of the fin heatsinks 196 and the longitudinal fluid channels 194 for convective heat transfer away from the radiator 180. The cooled cooling fluid (e.g., 5 degrees cooler, 10 degrees cooler, 15 degrees cooler, etc. than the heated cooling fluid entering the first chamber 150) flows through the second chamber 170 and the second flow port 126, through the fluid conduits 120, back to an inlet pump connector of the heat exchanger pump 110 to once again begin the cooling loop. In some embodiments, the radiator 180 may have a heat exchange capacity of at least 350 watts, between a range of around 350 watts to about 500 watts, less than or equal to about 500 watts, etc.

In one embodiment, the built-in fluid tank 130 of the radiator 180 is disposed at a bottom corner of the radiator 180, adjacent to a portion of the bottom encasement 191 and a portion of the second chamber 170. In some embodiments, the height of the built-in fluid tank 130 is equal to the height of three adjacent of the longitudinal fluid channels 194 and four adjacent spacings thereof, and the width spans across the three columns of the longitudinal fluid channels 194 and the width of the radiator 180. However, the present disclosure is not limited thereto.

Figure 3A:
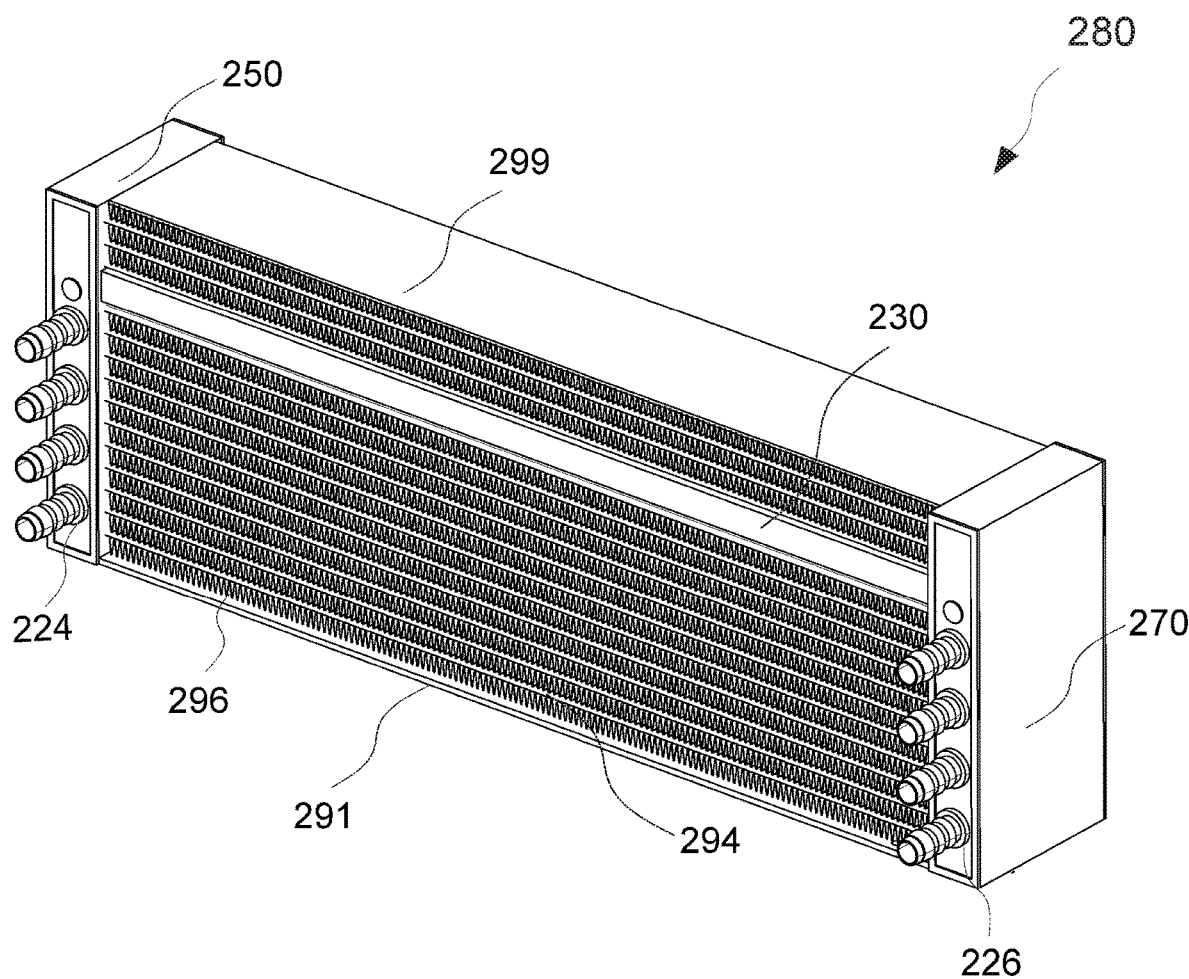
FIG. 3A is a schematic view of an alternative radiator in accordance with one embodiment of the disclosure.
Figure 3B:
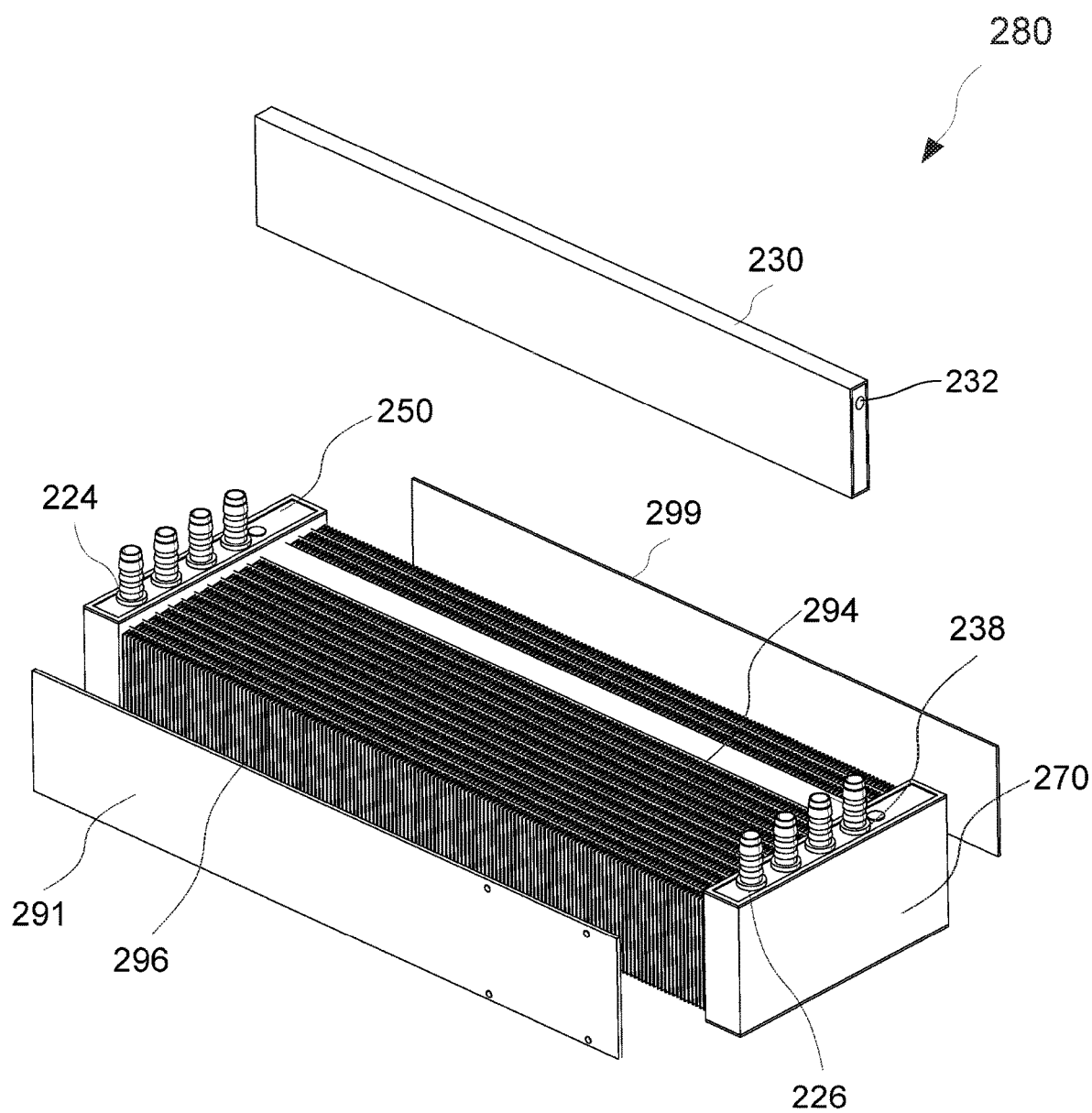
FIG. 3B is an exploded view of the alternative radiator of FIG. 3A.
Figure 3C:
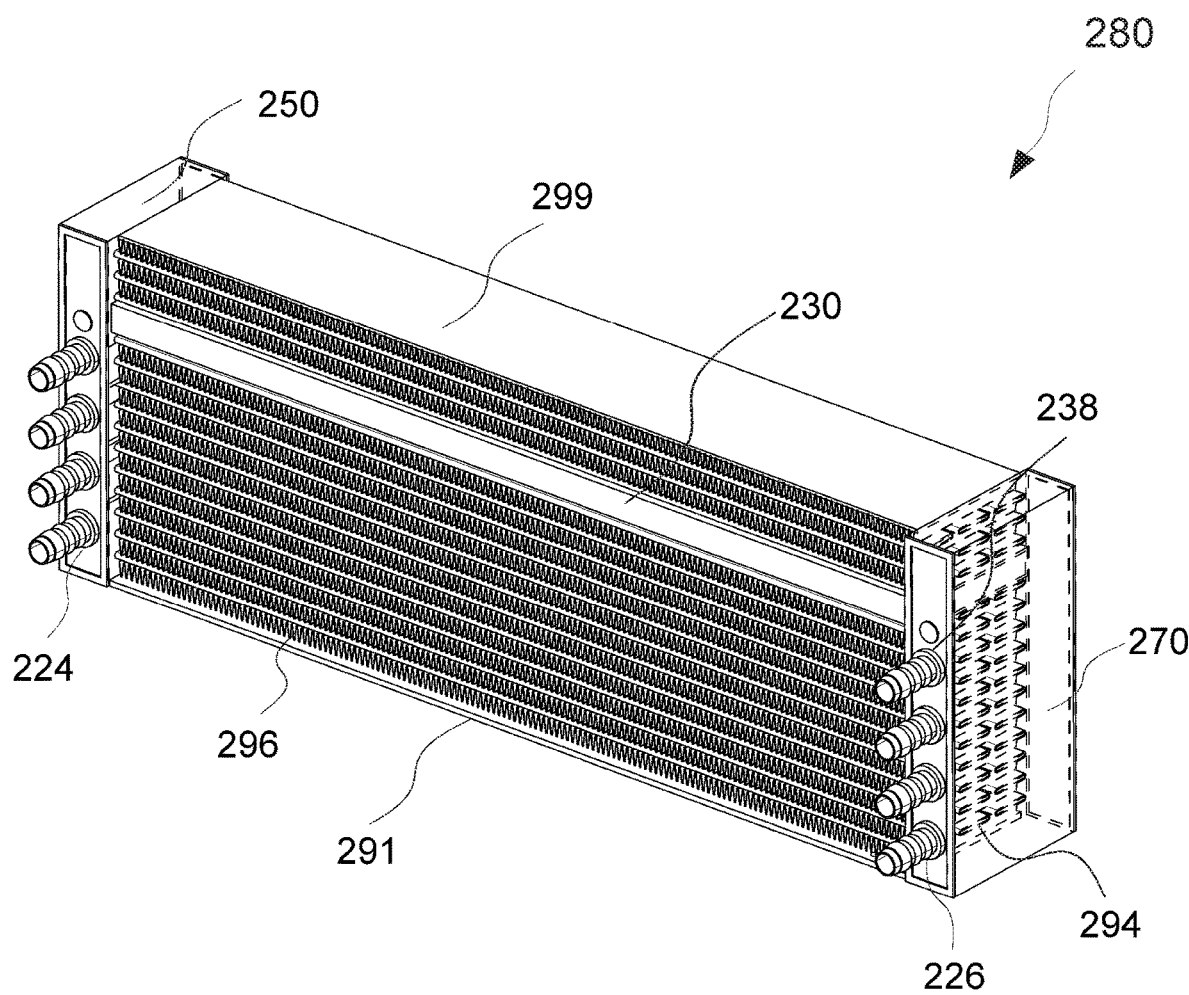
FIG. 3C illustrates an interior of a second end of the alternative radiator of FIG. 3A.
Figure 3D:
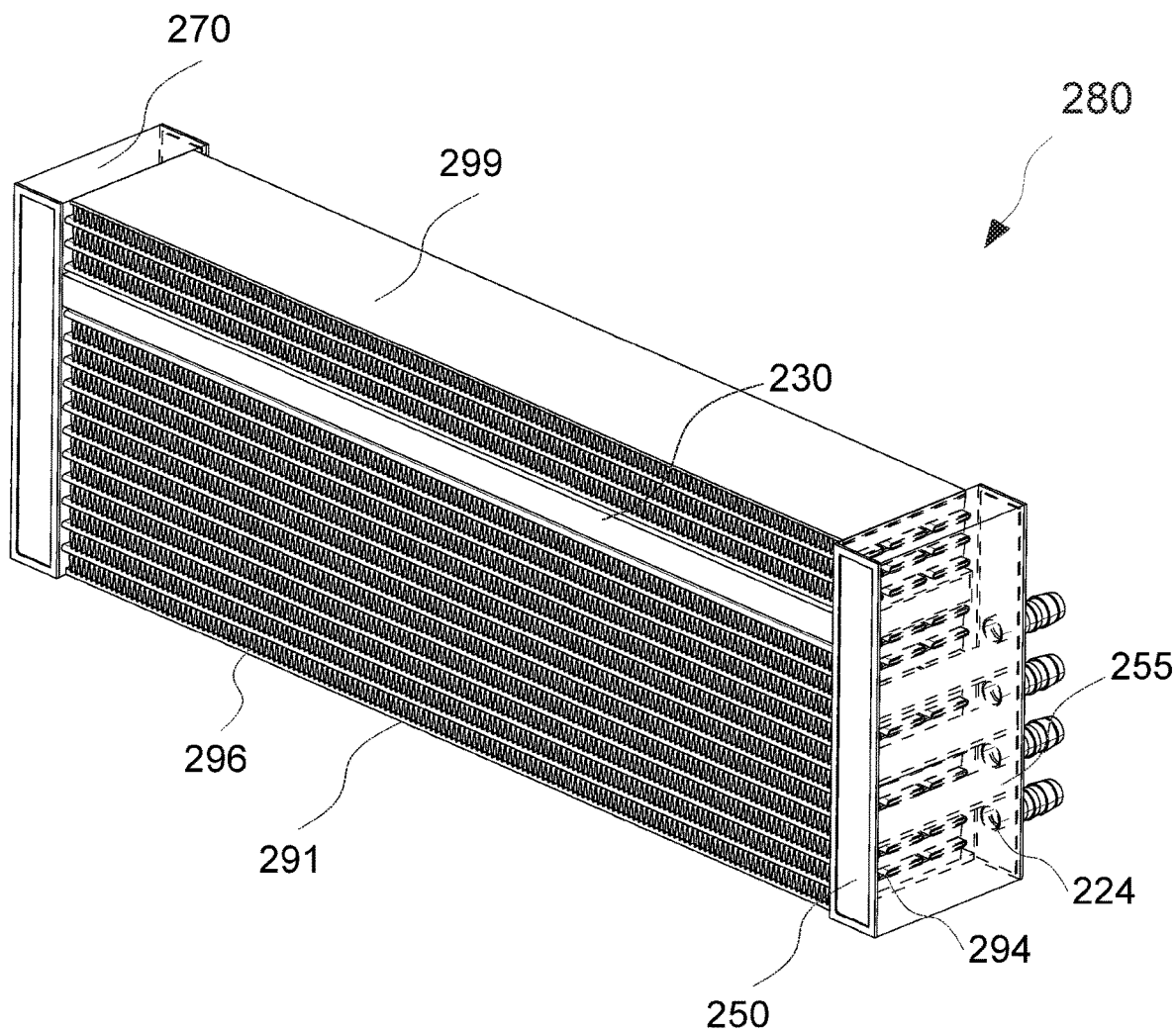
FIG. 3D illustrates an interior of a first end of the alternative radiator of FIG. 3A.

FIG. 3A is a schematic view of an alternative radiator in accordance with one embodiment of the disclosure. FIG. 3B is an exploded view of the alternative radiator of FIG. 3A. FIG. 3C illustrates an interior of a second end of the alternative radiator of FIG. 3A. FIG. 3D illustrates an interior of a first end of the alternative radiator of FIG. 3A. Referring to FIG. 3A to FIG. 3D, and referring to FIG. 1A to FIG. 2D, in an alternative embodiment, a radiator 280 having a built-in fluid tank 230 includes a first chamber 250 having at least one first flow port 224, a second chamber 270 having at least one second flow port 226 and opposite the first chamber 250, a top encasement 299, a bottom encasement 291 and a plurality of longitudinal fluid channels 294 disposed therebetween in rows and columns. The first chamber 250 includes at least one chamber separator 255 separating cooling fluid flow from each of the at least one first flow port 224 and communicating with the longitudinal fluid channels 294 via a water-tight seal for more efficient cooling fluid flow. A plurality of fin heatsinks 296 is transversely disposed across each of the adjacent spacing between the rows of the longitudinal fluid channels 294 and across each of the three row columns. The built-in fluid tank 230 of the radiator 280 is disposed within an area of the radiator 280 generally equal to the length of one of the longitudinal fluid channels 294, the height of one of the longitudinal fluid channels 294 and two adjacent spacings thereof, and the width across three columns of the longitudinal fluid channels 294 and the width of the radiator 280. The built-in fluid tank 230 is disposed above the first flow port 224 and the second flow port 226 closest to the top encasement 299.

In some embodiments, the built-in fluid tank 230 includes a tank outlet port 232 in fluid communication with the second chamber 270, and the second chamber 270 further includes a tank flow port 238. The tank outlet port 232 defines a passage for the cooling fluid to travel between the built-in fluid tank 230 and the second chamber 270. In some embodiments, a fill cap is removably disposed on an outside of the built-in fluid tank 230 for adding or removing cooling fluid to or from the built-in fluid tank 230.

The built-in fluid tank 230 provides a chamber for storing the cooling fluid. A volume of the cooling fluid may be retained in the built-in fluid tank 230 during operation of the computer liquid cooling system. In some embodiments, a visible portion of the cooling fluid in the built-in fluid tank 230 via a transparent material may allow users to visually observe an amount of the cooling fluid in the cooling loop, and determine when additional cooling fluid may need to be added to the computer liquid cooling system. No additional space is needed to be allocated for the built-in fluid tank 230, fluid loss over time due to permeation may be mitigated, and air bubbles may gradually be replaced during fluid circulation, increasing cooling loop efficiency of the computer liquid cooling system.

Figure 4A:
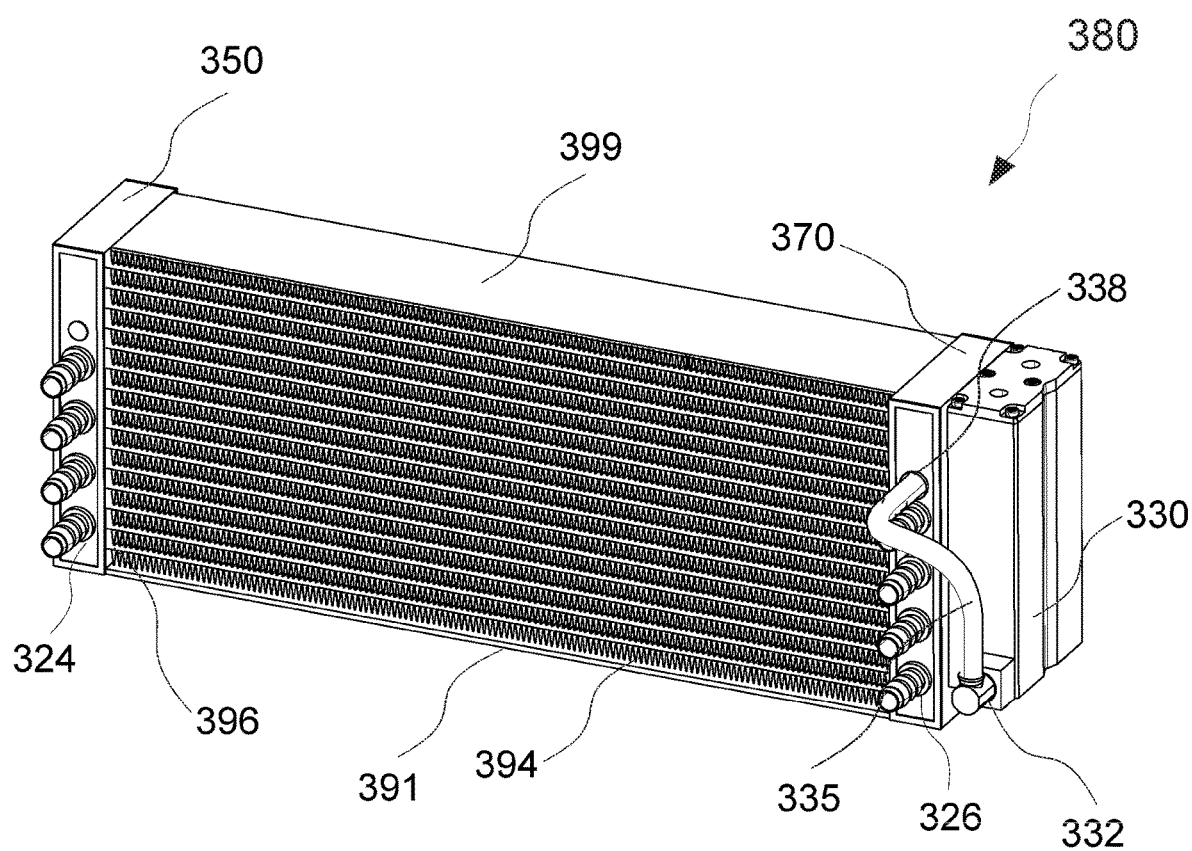
FIG. 4A is a schematic view of an another alternative radiator in accordance with one embodiment of the disclosure.
Figure 4B:
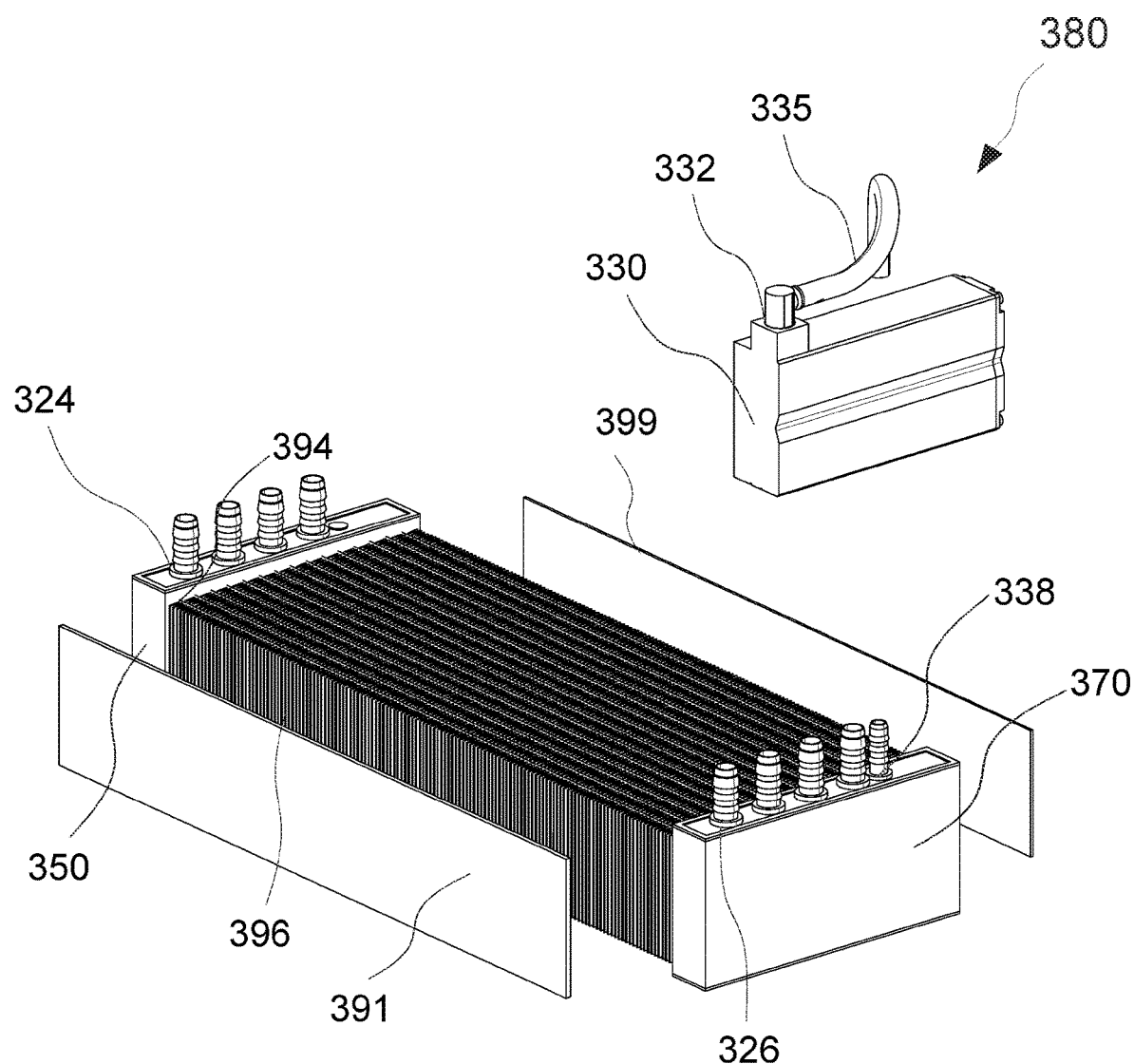
FIG. 4B is an exploded view of the another alternative radiator of FIG. 4A.
Figure 4C:
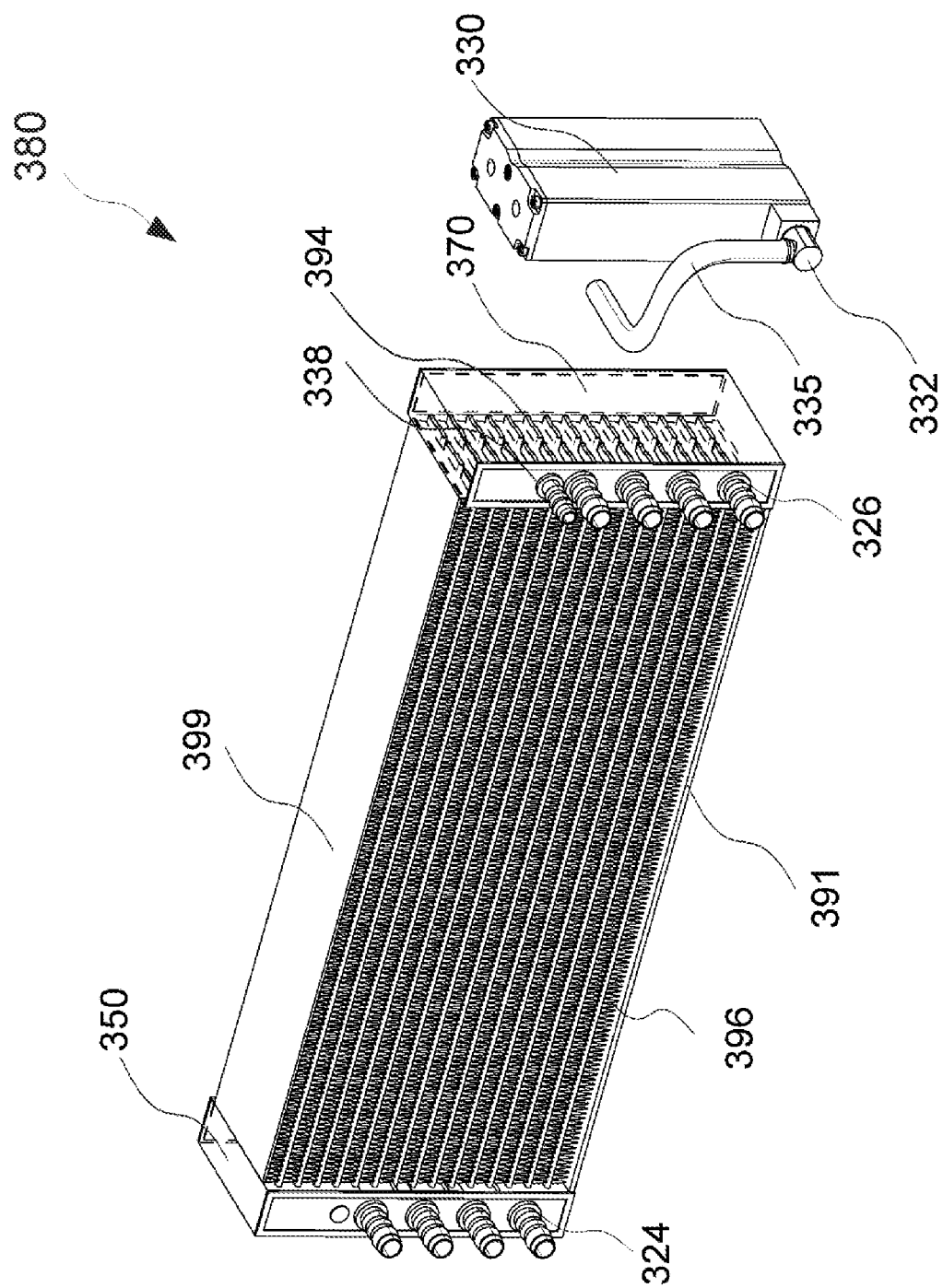
FIG. 4C illustrates an interior of a second end of the another alternative radiator of FIG. 4A.
Figure 4D:
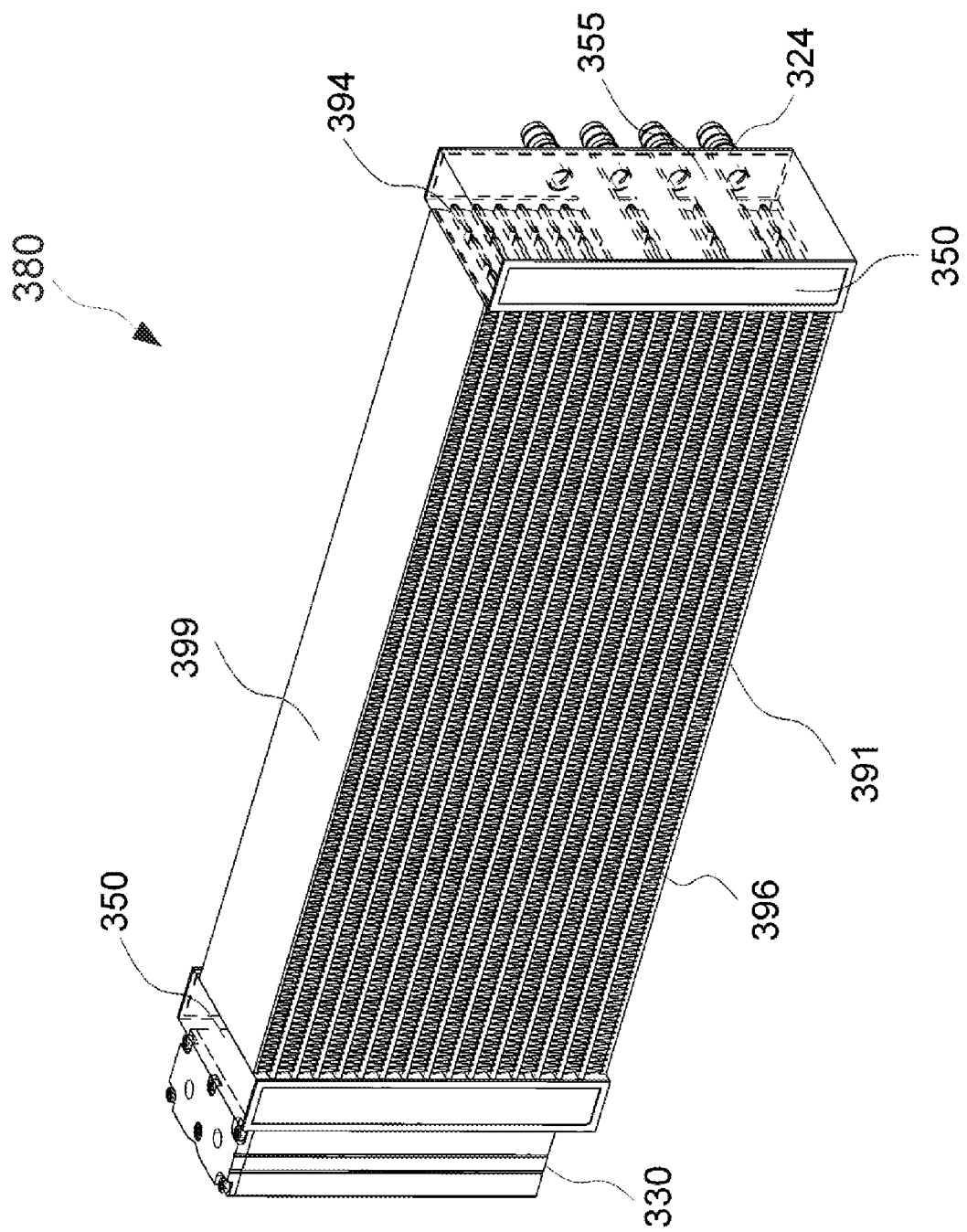
FIG. 4D illustrates an interior of a first end of the another alternative radiator of FIG. 4A.

FIG. 4A is a schematic view of an another alternative radiator in accordance with one embodiment of the disclosure. FIG. 4B is an exploded view of the another alternative radiator of FIG. 4A. FIG. 4C illustrates an interior of a second end of the another alternative radiator of FIG. 4A. FIG. 4D illustrates an interior of a first end of the another alternative radiator of FIG. 4A. Referring to FIG. 4A to FIG. 4D, and referring to FIG. 1A to FIG. 3D, in another alternative embodiment, a radiator 380 having a built-in fluid tank 330 includes a first chamber 350 having at least one first flow port 324, a second chamber 370 having at least one second flow port 326 and opposite the first chamber 350, a top encasement 399, a bottom encasement 391 and a plurality of longitudinal fluid channels 394 disposed therebetween in rows and columns. The first chamber 350 includes at least one chamber separator 355 separating cooling fluid flow from each of the at least one first flow port 324 and communicating with the longitudinal fluid channels 394 via a water-tight seal for more efficient cooling fluid flow. The built-in fluid tank 330 of the radiator 380 is disposed at one side of the radiator 380, adjacent to the second chamber 370, opposite the longitudinal fluid channels 394 and the fin heatsinks 396. In some embodiments, the height and width of the built-in fluid tank 330 is equal to the height and width of the radiator 380 and the volume thereof is greater than the volume of the second chamber 370.

In some embodiments, the built-in fluid tank 330 includes a tank outlet port 332 and the second chamber 370 further includes a tank flow port 338. The tank outlet port 332 defines a passage for the cooling fluid to travel between the built-in fluid tank 330 and the second chamber 370 via a tank conduit 335. In some embodiments, a fill cap is removably disposed with the tank outlet port 332 and the tank conduit 335 may be coupled thereto. The fill cap is disposed adjacent to a portion of the second chamber 370 for adding or removing cooling fluid to or from the built-in fluid tank 330.

The built-in fluid tank 330 provides a chamber for storing the cooling fluid. A volume of the cooling fluid may be retained in the built-in fluid tank 330 during operation of the computer liquid cooling system. In some embodiments, a visible portion of the cooling fluid in the built-in fluid tank 330 via a transparent material may allow users to visually observe an amount of the cooling fluid in the cooling loop, and determine when additional cooling fluid may need to be added to the computer liquid cooling system. Via the built-in fluid tank 330, fluid loss over time due to permeation may be mitigated, and air bubbles may gradually be replaced during fluid circulation, increasing cooling loop efficiency of the computer liquid cooling system.

Figure 5A:
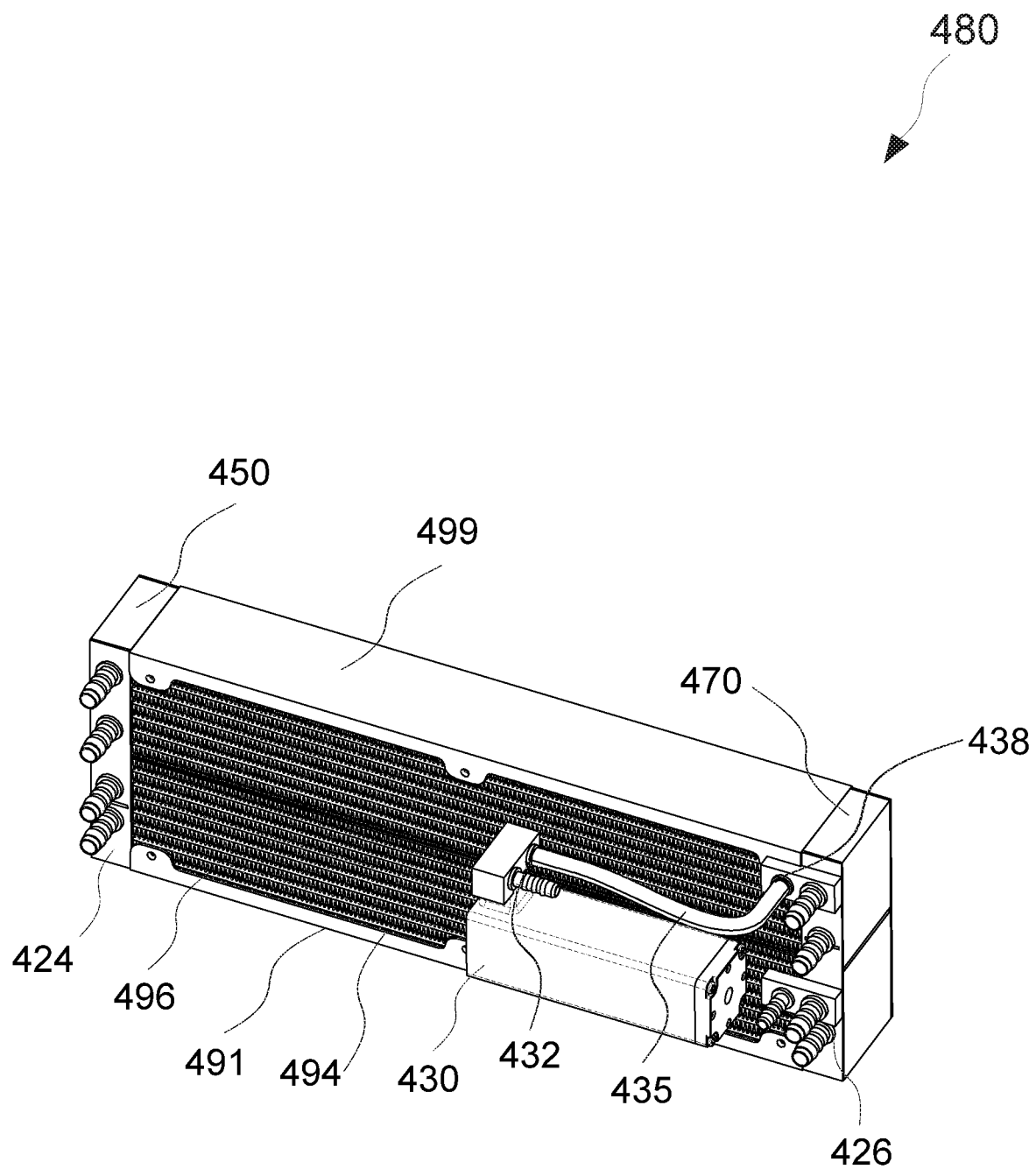
FIG. 5A is a schematic view of yet another alternative radiator in accordance with one embodiment of the disclosure.
Figure 5B:
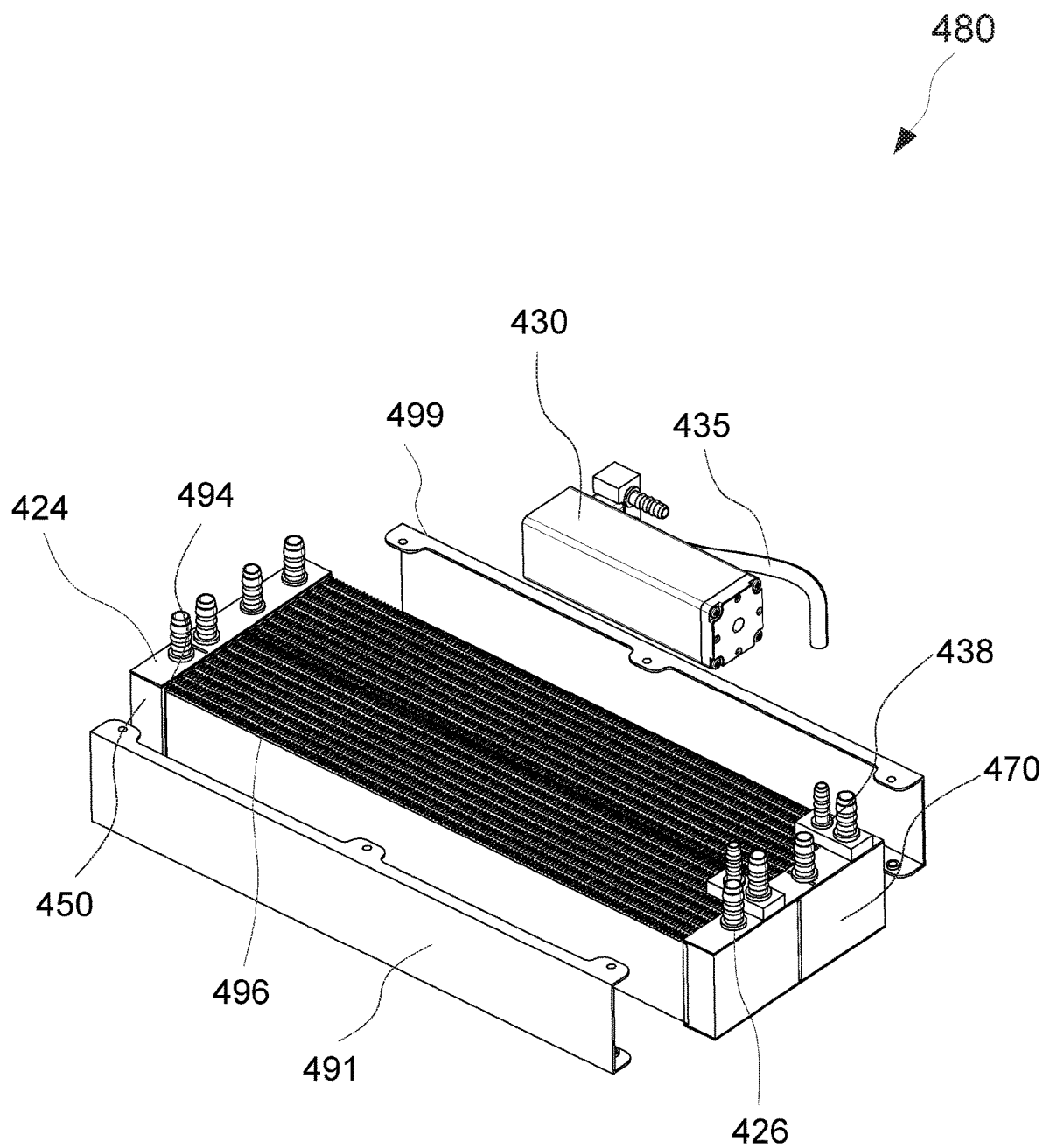
FIG. 5B is an exploded view of the yet another alternative radiator of FIG. 5A.
Figure 5C:
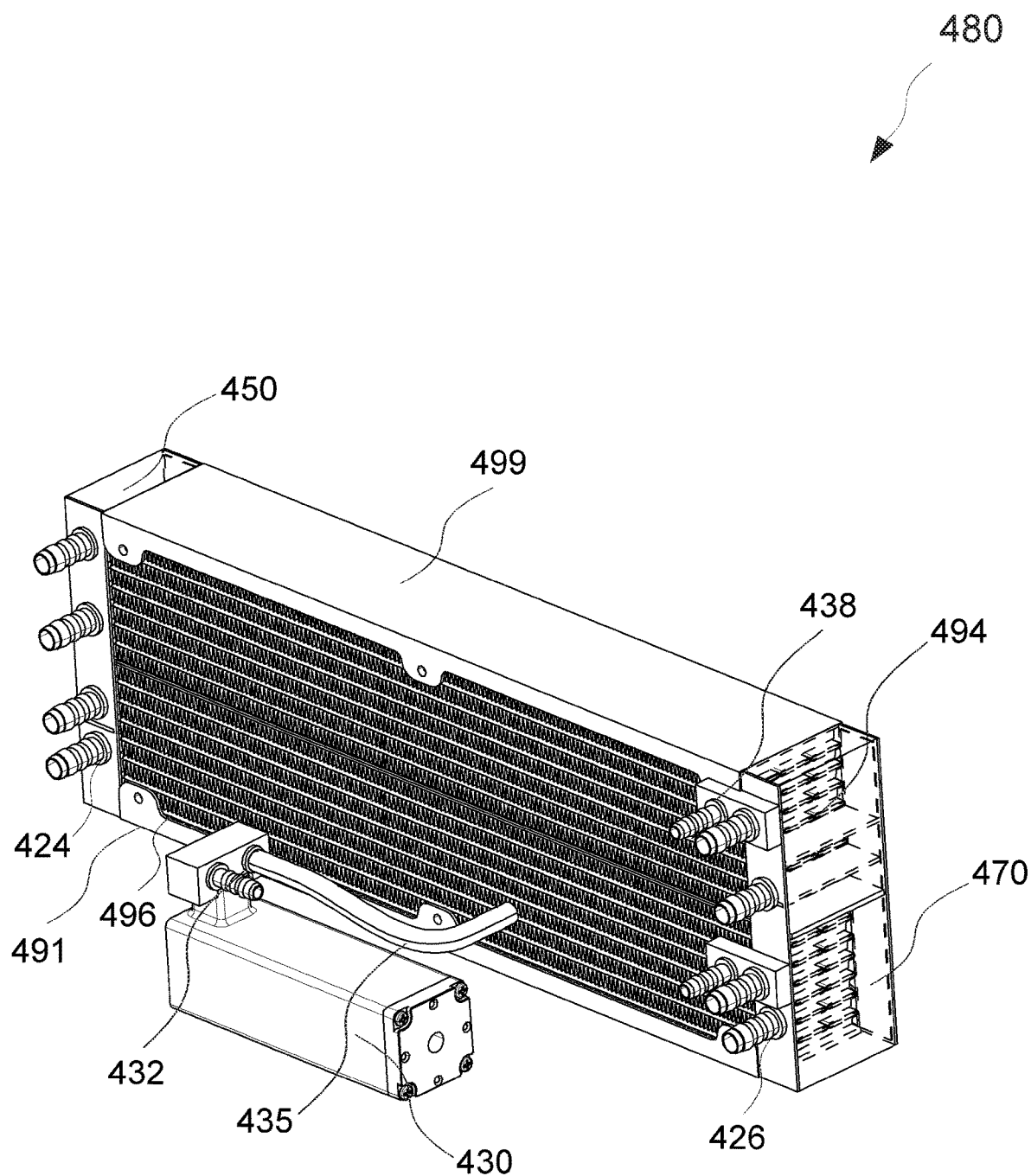
FIG. 5C illustrates an interior of a second end of the yet another alternative radiator of FIG. 5A.
Figure 5D:
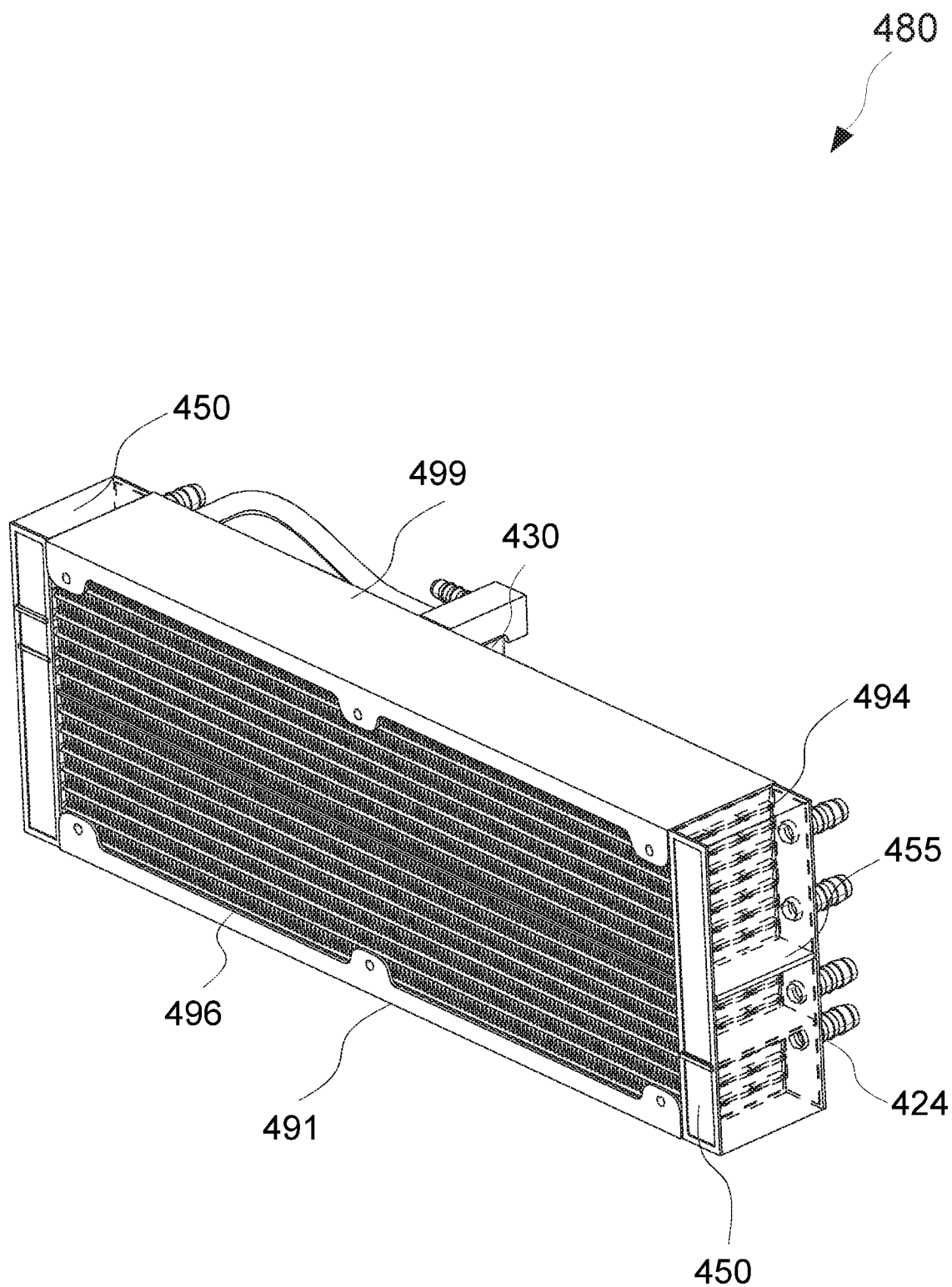
FIG. 5D illustrates an interior of a first end of the yet another alternative radiator of FIG. 5A.

FIG. 5A is a schematic view of yet another alternative radiator in accordance with one embodiment of the disclosure. FIG. 5B is an exploded view of the yet another alternative radiator of FIG. 5A. FIG. 5C illustrates an interior of a second end of the yet another alternative radiator of FIG. 5A. FIG. 5D illustrates an interior of a first end of the yet another alternative radiator of FIG. 5A. Referring to FIG. 5A to FIG. 5D, and referring to FIG. 1A to FIG. 4D, in yet another alternative embodiment, a radiator 480 having a built-in fluid tank 430 includes a first chamber 450 having at least one first flow port 424, a second chamber 470 having at least one second flow port 426 and opposite the first chamber 450, a top encasement 499, a bottom encasement 491 and a plurality of longitudinal fluid channels 494 disposed therebetween in rows and columns. The first chamber 450 includes at least one chamber separator 455 separating cooling fluid flow from each of the at least one first flow port 424 and communicating with the longitudinal fluid channels 494 via a water-tight seal for more efficient cooling fluid flow. The built-in fluid tank 430 of the radiator 480 is disposed at a longitudinal side of the radiator 480, perpendicular to the second chamber 470, longitudinal to the longitudinal fluid channels 494 and the fin heatsinks 496. In some embodiments, the volume of the built-in fluid tank 430 is greater than the volume of the second chamber 470.

In some embodiments, the built-in fluid tank 430 includes a tank outlet port 432 and the second chamber 470 further communicates with a tank flow port 438. The tank outlet port 432 defines a passage for the cooling fluid to travel between the built-in fluid tank 430 and the second chamber 470 via a tank conduit 435. In some embodiments, a fill cap is removably disposed with the tank outlet port 432 and the tank conduit 435 may be coupled thereto. The fill cap is disposed adjacent to a portion of the second chamber 470 for adding or removing cooling fluid to or from the built-in fluid tank 430.

The built-in fluid tank 430 provides a chamber for storing the cooling fluid. A volume of the cooling fluid may be retained in the built-in fluid tank 430 during operation of the computer liquid cooling system. In some embodiments, a visible portion of the cooling fluid in the built-in fluid tank 430 via a transparent material may allow users to visually observe an amount of the cooling fluid in the cooling loop, and determine when additional cooling fluid may need to be added to the computer liquid cooling system. Via the built-in fluid tank 430, fluid loss over time due to permeation may be mitigated, and air bubbles may gradually be replaced during fluid circulation, increasing cooling loop efficiency of the computer liquid cooling system.

In some embodiments, the radiator may be made of a single piece of conductive material, such as copper, but the present disclosure is not limited thereto. Those of ordinary skill in the relevant art may readily appreciate that in alternative embodiments, other conductive materials may be used depending on application, dimensions, and available space.

In some embodiments, the heat exchanger pump 110 may be fastened to a heat generating device by any suitable fastening means such as soldering, brazing or by means of thermal paste combined with glue. Alternatively, other fastening means may be provided for ensuring direct thermal contact between the free surface of the heat generating device and the computer liquid cooling system, such as a removable coupling means.

In some embodiments, the computer liquid cooling system is configured to cool each heat generating device included within a computer chassis or electronic system. In alternative embodiments, the computer liquid cooling system is configured to cool only select heat generating devices, or only a single heat generating device, while other heat generating devices are left to be cooled by other or complimentary means.

In the embodiments, a computer liquid cooling system is provided. The computer liquid cooling system includes a radiator having a built-in fluid tank, at least one heat exchanger pump, and a plurality of fluid conduits. Heat generated from a heat generating device is transferred to cooling fluid flowing through the heat exchanger pump, and then output to the radiator. The heated cooling fluid flows through the radiator having the built-in fluid tank, cooling along a plurality of heat exchanger fins. The cooling fluid flows to the heat exchanger pump to once again begin the cooling loop. The built-in fluid tank not only accounts for fluid loss over time due to permeation, it also decreases air bubbles leading to greater efficiency as air bubbles are gradually replaced during fluid circulation. Additionally, the built-in fluid tank eliminates the need for separated assembly of a reservoir. Thus, it is no longer necessary to allocate for the positioning of the reservoir within the computer chassis or electronic system, decreasing total installation time, risks for leakage, and component placement problems.

The presently disclosed inventive concepts are not intended to be limited to the embodiments shown herein, but are to be accorded their full scope consistent with the principles underlying the disclosed concepts herein. Directions and references to an element, such as "up," "down,", "upper," "lower," "horizontal," "vertical," "left," "right," and the like, do not imply absolute relationships, positions, and/or orientations. Terms of an element, such as "first" and "second" are not literal, but, distinguishing terms. As used herein, terms "comprises" or "comprising" encompass the notions of "including" and "having" and specify the presence of elements, operations, and/or groups or combinations thereof and do not imply preclusion of the presence or addition of one or more other elements, operations and/or groups or combinations thereof. Sequence of operations do not imply absoluteness unless specifically so stated. Reference to an element in the singular, such as by use of the article "a" or "an", is not intended to mean "one and only one" unless specifically so stated, but rather "one or more". As used herein, "and/or" means "and" or "or", as well as "and" and "or." As used herein, ranges and subranges mean all ranges including whole and/or fractional values therein and language which defines or modifies ranges and subranges, such as "at least," "greater than," "less than," "no more than," and the like, mean subranges and/or an upper or lower limit. All structural and functional equivalents to the elements of the various embodiments described throughout the disclosure that are known or later come to be known to those of ordinary skill in the relevant art are intended to be encompassed by the features described and claimed herein. Moreover, nothing disclosed herein is intended to be dedicated to the public regardless of whether such disclosure may ultimately explicitly be recited in the claims. No element or concept disclosed herein or hereafter presented shall be construed under the provisions of 35 USC 112(f) unless the element or concept is expressly recited using the phrase "means for" or "step for".

In view of the many possible embodiments to which the disclosed principles can be applied, we reserve the right to claim any and all combinations of features and acts described herein, including the right to claim all that comes within the scope and spirit of the foregoing description, as well as the combinations recited, literally and equivalently, in the following claims and any claims presented anytime throughout prosecution of this application or any application claiming benefit of or priority from this application.

The embodiments were chosen and described in order to best explain the principles of the disclosure and its practical applications, to thereby enable others skilled in the art to best utilize the disclosure and various embodiments with various modifications as are suited to the particular use contemplated. It is intended that the scope of the disclosure be defined by the following claims and their equivalents.

What is claimed is:

1. A computer liquid cooling system, comprising:
a radiator, having a built-in fluid tank, the radiator comprising a first chamber, a second chamber and a plurality of longitudinal fluid channels, wherein each of the plurality of longitudinal fluid channels is connected to the first chamber and the second chamber;
at least one heat exchanger pump; and
a plurality of fluid conduits, coupled to the at least one heat exchanger pump, the first chamber and the second chamber so as to form a cooling loop for a cooling fluid to circulate therein;
wherein the built-in fluid tank is in fluid communication with the second chamber via a tank conduit, the built-in fluid tank provides a chamber for storing the cooling fluid, and the built-in fluid tank is disposed between the first chamber and the second chamber or disposed on one side of the second chamber located away from the first chamber;
wherein the built-in fluid tank includes a tank outlet port, the tank outlet port is the only one through hole of the built-in fluid tank, the tank conduit is connected to the tank outlet port and a tank flow port of the second chamber, so that the built-in fluid tank is in fluid communication with the second chamber.

2. The computer liquid cooling system according to claim 1, wherein the radiator further comprises a top encasement and a bottom encasement, the top encasement and the bottom encasement are disposed between the first chamber and the second chamber, the plurality of longitudinal fluid channels is disposed between the top encasement and the bottom encasement in rows and columns, the built-in fluid tank is disposed between the first chamber and the second chamber, and the built-in fluid tank is located at a bottom corner of the radiator, adjacent to a portion of the bottom encasement and a portion of the second chamber.

3. The computer liquid cooling system according to claim 2, wherein a total number of the plurality of longitudinal fluid channels is forty-five, the plurality of longitudinal fluid channels is disposed in fifteen rows and three columns, a height of the built-in fluid tank is equal to a height of three adjacent of the plurality of longitudinal fluid channels and four adjacent spacings thereof, and a width of the built-in fluid tank spans across the three columns of the plurality of longitudinal fluid channels and a width of the radiator.

4. The computer liquid cooling system according to claim 1, wherein the radiator further comprises a top encasement and a bottom encasement, the top encasement and the bottom encasement are disposed between the first chamber and the second chamber, the plurality of longitudinal fluid channels is disposed between the top encasement and the bottom encasement in rows and columns, the built-in fluid tank is disposed between the first chamber and the second chamber, and the built-in fluid tank is disposed between two of the plurality of longitudinal fluid channels and extends from the first chamber to the second chamber.

5. The computer liquid cooling system according to claim 4, wherein the built-in fluid tank is disposed within an area of the radiator generally equal to a length of one of the plurality of longitudinal fluid channels, a height of one of the longitudinal fluid channels and two adjacent spacings thereof, and a width across three columns of the plurality of longitudinal fluid channels and a width of the radiator.

6. The computer liquid cooling system according to claim 5, wherein the first chamber further has at least one first flow port, the second chamber further has at least one second flow port, the plurality of fluid conduits are attached to the at least one first flow port and the at least one second flow port so as to connect the at least one heat exchanger pump to the first chamber and the second chamber, and the built-in fluid tank is disposed above the at least one first flow port and the at least one second flow port.

7. The computer liquid cooling system according to claim 1, wherein the built-in fluid tank is disposed on one side of the second chamber located away from the first chamber, and the built-in fluid tank abuts the second chamber.

8. The computer liquid cooling system according to claim 7, wherein a volume of the built-in fluid tank is greater than a volume of the second chamber.

9. The computer liquid cooling system according to claim 1, wherein the radiator further comprises a top encasement and a bottom encasement, the top encasement and the bottom encasement are disposed between the first chamber and the second chamber, the plurality of longitudinal fluid channels is disposed between the top encasement and the bottom encasement in rows and columns, the built-in fluid tank is disposed between the first chamber and the second chamber, and the built-in fluid tank is disposed on one side of the plurality of longitudinal fluid channels.

10. The computer liquid cooling system according to claim 9, wherein the built-in fluid tank is disposed at a longitudinal side of the radiator, perpendicular to the second chamber and longitudinal to the plurality of longitudinal fluid channels.

11. The computer liquid cooling system according to claim 9, wherein a volume of the built-in fluid tank is greater than a volume of the second chamber.

12. The computer liquid cooling system according to claim 1, wherein the plurality of fluid conduits is manufactured from a flexible plastic material and/or a rigid metal material.

13. The computer liquid cooling system according to claim 1, wherein a thin layer of metal coating is provided on either or on both of an internal side or an external side of the plurality of fluid conduits.

14. The computer liquid cooling system according to claim 13, wherein the thin layer of metal coating is copper.

15. The computer liquid cooling system according to claim 1, wherein a total number of the plurality of longitudinal fluid channels is forty-five, and the plurality of longitudinal fluid channels is disposed in fifteen rows and three columns.

16. The computer liquid cooling system according to claim 1, wherein the radiator further comprises a plurality of fin heatsinks, the plurality of fin heatsinks is disposed between the first chamber and the second chamber, and the plurality of fin heatsinks is transversely disposed across each of adjacent spacing between rows of the plurality of longitudinal fluid channels.

17. The computer liquid cooling system according to claim 1, wherein the plurality of longitudinal fluid channels is disposed in rows and columns, each adjacent two of the plurality of longitudinal fluid channels are separated by a spacing, and the spacing between the rows of the plurality of longitudinal fluid channels is larger than the spacing between the columns of the plurality of longitudinal fluid channels.

* * * * *